US012607790B2

(12) United States Patent
Park et al.

(10) Patent No.: US 12,607,790 B2
(45) Date of Patent: Apr. 21, 2026

(54) FOLDABLE DISPLAY DEVICE AND METHOD FOR MANUFACTURING THE SAME

(71) Applicant: LG DISPLAY CO., LTD., Seoul (KR)

(72) Inventors: Seungun Park, Paju-si (KR); Seoyoung Lee, Jeonju-si (KR); Hyejeong Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 886 days.

(21) Appl. No.: 17/857,839

(22) Filed: Jul. 5, 2022

(65) Prior Publication Data

US 2023/0009733 A1      Jan. 12, 2023

(30) Foreign Application Priority Data

Jul. 12, 2021    (KR) ........................ 10-2021-0090821

(51) Int. Cl.
| | |
|---|---|
| *H10K 59/80* | (2023.01) |
| *G02B 1/14* | (2015.01) |
| *G02B 5/20* | (2006.01) |
| *G02B 5/30* | (2006.01) |
| *H10K 102/00* | (2023.01) |

(52) U.S. Cl.
CPC .............. *G02B 5/208* (2013.01); *G02B 1/14* (2015.01); *G02B 5/3083* (2013.01); *H10K 59/8792* (2023.02); *H10K 59/8793* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 9,091,814 B2 | 7/2015 | Kang | |
| 10,234,693 B2 | 3/2019 | Lim et al. | |
| 10,620,465 B2 | 4/2020 | Lee et al. | |
| 10,792,901 B2 | 10/2020 | Isojima et al. | |
| 2009/0086326 A1* | 4/2009 | Hamamoto | G02B 1/111 359/601 |
| 2016/0223722 A1* | 8/2016 | Ahn | G02B 1/14 |
| 2020/0064968 A1* | 2/2020 | Kim | G06F 3/0445 |
| 2021/0132724 A1* | 5/2021 | Kwon | H10K 59/12 |

(Continued)

FOREIGN PATENT DOCUMENTS

| | | |
|---|---|---|
| CN | 109523917 A | 3/2019 |
| CN | 109844847 A | 6/2019 |

(Continued)

OTHER PUBLICATIONS

Office Action issued on Jun. 19, 2025 in Chinese Patent Application No. 202210788233.7 with English translation.

(Continued)

*Primary Examiner* — Michelle Mandala
(74) *Attorney, Agent, or Firm* — Morgan, Lewis & Bockius LLP

(57)     ABSTRACT

A foldable display device includes a display panel, a protective base disposed on a top surface of the display panel, a polarizing plate disposed on a top surface of the protective base, a light blocking layer disposed at an edge of a top surface of the polarizing plate, and a hard coating layer for covering the polarizing plate and the light blocking layer and including a UV absorbent.

11 Claims, 5 Drawing Sheets

100-1

(56)         References Cited

U.S. PATENT DOCUMENTS

| 2021/0191576 | A1* | 6/2021 | Kwon | G06F 3/0448 |
|---|---|---|---|---|
| 2021/0247810 | A1* | 8/2021 | Kim | G09F 9/301 |
| 2021/0357061 | A1 | 11/2021 | Ishihara et al. | |
| 2023/0071460 | A1* | 3/2023 | Ko | H10K 59/82 |

FOREIGN PATENT DOCUMENTS

| CN | 113056781 A | 6/2021 |
|---|---|---|
| KR | 2013-0054844 A | 5/2013 |
| KR | 10-2017-0000031 A | 1/2017 |
| KR | 10-2017-0086373 A | 7/2017 |
| KR | 10-2019-0032686 A | 3/2019 |

OTHER PUBLICATIONS

Office Action issued on May 7, 2025 in Korean Patent Application No. 10-2021-0090821 with English translation.
Office Action issued on Jul. 19, 2024 in Korean Patent Application No. 10-2021-0090821.

* cited by examiner

100

100-1

FOLDABLE DISPLAY DEVICE AND METHOD FOR MANUFACTURING THE SAME

CROSS-REFERENCE TO RELATED APPLICATION

This application claims priority from Korean Patent Application No. 10-2021-0090821 filed on Jul. 12, 2021 in the Korean Intellectual Property Office, and all the benefits accruing therefrom under 35 U.S.C. 119, the contents of which in its entirety are herein incorporated by reference.

BACKGROUND

Technical Field

The present disclosure relates to a foldable display device and a method for manufacturing the same. Specifically, the present disclosure relates to a foldable display device having a UV blocking function and a method for manufacturing the same.

Discussion of the Related Art

As we enter a full-fledged information era, various display devices that process and display a large amount of information have been developed. There are various types of display devices that display images, such as a liquid crystal display device (LCD), an organic light-emitting display device (OLED), an electrophoretic display device (EPD), and the like.

Users who watch a broadcast or a video or enjoy a video game via the display device tend to prefer a portable display device having a large screen. However, when the screen of the portable display device is enlarged, portability is reduced, so that there is a limit to enlarging the screen. In order to improve the portability, research on a foldable display device capable of folding and unfolding a display panel is being actively conducted.

SUMMARY

When a foldable display device without a UV blocking function is exposed to a UV ray for a long time, due to a change of physical properties of a polarizing plate by the UV ray, there is a problem in that a color of reflected light is greenish. Moreover, various form factors for the foldable display devices are being developed, and a foldable display device having a small thickness is required to be applied to the various form factors. Accordingly, the inventors of the present disclosure have invented a foldable display device having the UV blocking function and having the small thickness.

Accordingly, embodiments of the present disclosure are directed to a foldable display device and a method for manufacturing the same that substantially obviate one or more of the problems due to limitations and disadvantages of the related art.

An aspect of the present disclosure is to provide a foldable display device having a UV blocking function and having a small thickness.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a foldable display device comprises a display panel, a protective base disposed on a top surface of the display panel, a polarizing plate disposed on a top surface of the protective base, a light blocking layer disposed at an edge of a top surface of the polarizing plate, and a hard coating layer for covering the polarizing plate and the light blocking layer and including a UV absorbent.

In another aspect, a foldable display device comprises a display panel, a first optical member disposed on the display panel, a second optical member disposed on the first optical member, a light blocking layer disposed at an edge of a top surface of the second optical member, and a hard coating layer for covering the second optical member and the light blocking layer and including a UV absorbent.

In another aspect, a foldable display device comprises a display panel, and an optical stacked structure disposed on the display panel, and the optical stacked structure includes a transparent base, a light blocking layer disposed at an edge of a top surface of the transparent base, a hard coating layer for covering the top surface of the transparent base and the light blocking layer and including a UV absorbent, a polarizer disposed on a bottom surface of the transparent base, and a phase retardation layer disposed beneath the polarizer.

In another aspect, a method for manufacturing a foldable display device comprises forming a light blocking layer at an edge of a top surface of a transparent base, forming a hard coating layer including a UV absorbent to cover the top surface of the transparent base and the light blocking layer, forming a polarizer on a bottom surface of the transparent base, and forming a phase retardation layer on a bottom surface of the polarizer.

Other specific details of the embodiment are included in the detailed description and the drawings.

According to an embodiment of the present disclosure, the light blocking layer is disposed at the edge of the top surface of the protective base or the polarizing plate and immediately the hard coating layer is disposed to cover the top surface of the protective base or the polarizing plate and the light blocking layer, so that not only the overall thickness of the foldable display device may be reduced, but also the foldable display device may be folded with the smaller curvature radius. Therefore, it is possible to implement the foldable display device having the smaller thickness in the folded state.

Moreover, according to an embodiment of the present disclosure, because the number of stacked components in the foldable display device may be reduced, it is possible to simplify the manufacturing process and reduce the manufacturing cost.

Further, according to an embodiment of the present disclosure, because the foldable display device has the structure in which the hard coating layer that blocks the UV ray is disposed on the top surface of the protective base or the polarizing plate, it is possible to prevent the change of the physical properties of the polarizing plate, and accordingly, it is possible to prevent the color of light reflected by the foldable display device from being greenish even when the foldable display device is exposed to the UV ray for a long time.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
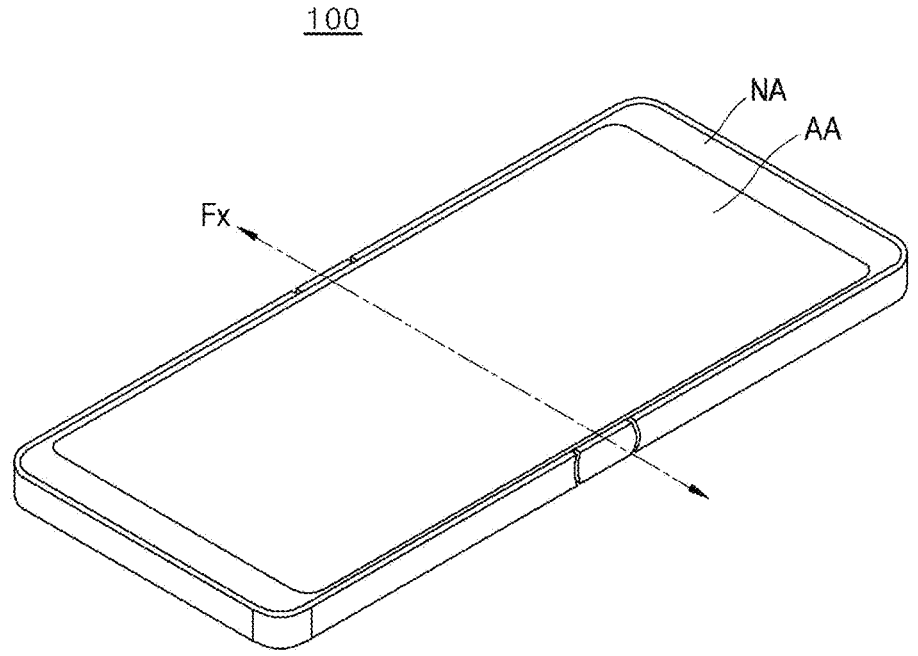
FIG. 1 is a perspective view showing a foldable display device according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or"

includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

As used herein, the term "substantially," "about," and similar terms are used as terms of approximation, and are intended to account for inherent deviations in measured or calculated values that would be recognized by those of ordinary skill in the art. The term may be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, foldable display devices according to embodiments of the present disclosure will be described in detail with reference to the accompanying drawings.

FIG. 1 is a perspective view showing a foldable display device according to an embodiment of the present disclosure.

Referring to FIG. 1, a foldable display device 100 according to an embodiment of the present disclosure may include a display area AA, a non-display area NA, and a foldable area. The display area AA may be an area in which an image is displayed. The non-display area NA may be an area that is located at an edge of the display area AA and does not display the image. The foldable area may be an area that is formed around a folding axis Fx and overlaps a portion of the display area AA and a portion of the non-display area NA. For example, the foldable area may be an area bent with a predefined curvature when the foldable display device 100 is folded using at least one scheme among inner folding and outer folding. An area other than the foldable area may be a non-foldable area. Moreover, the foldable display device 100 may further include a hinge structure for folding a display panel and the like, and a casing for supporting and accommodating the display panel and the like.

Figure 2:
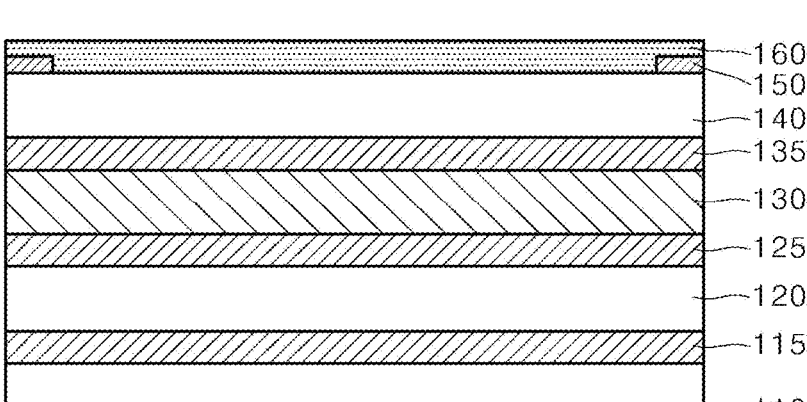
FIG. 2 is a cross-sectional view of a foldable display device according to an embodiment of the present disclosure.

FIG. 2 is a cross-sectional view of a foldable display device according to an embodiment of the present disclosure.

Referring to FIG. 2, the foldable display device 100 according to an embodiment of the present disclosure may include a display panel 120, a support structure 110, a polarizing plate 130, a protective base 140, a light blocking layer 150, and a hard coating layer 160.

The display panel 120 may be disposed on the support structure 110, and the polarizing plate 130 may be disposed on the display panel 120. The protective base 140 may be disposed on the polarizing plate 130, and the light blocking layer 150 may be disposed on a portion of a top surface of the protective base 140. Moreover, the hard coating layer 160 may be disposed on the top surface of the protective base 140 and on the light blocking layer 150.

The display panel 120 may be flexible and may display the image to a user. For example, the display panel 120 may be formed as an organic light-emitting display panel, but the present disclosure may not be necessarily limited thereto. The display panel 120 may be of various types, for example, a liquid crystal display panel, an electrophoretic display panel, and the like. When the display panel 120 is the organic light-emitting display panel, the display panel 120 may include a thin-film transistor array in which thin-film transistors (including switching thin-film transistors and driving thin-film transistors) are formed for each pixel on a substrate, an organic light-emitting layer in which organic light-emitting elements connected to the driving thin-film transistor are formed for each pixel, and an encapsulation layer that covers the organic light-emitting layer to prevent penetration of moisture and oxygen from the outside. A touch electrode array formed on the encapsulation layer may be further included.

The support structure 110 may support the display panel 120. The support structure 110 may include at least one support layer. The support structure 110 may be attached to the display panel 120 using an adhesive layer. The support layer has a greater stiffness than the display panel 120. For example, the support layer may be made of a metal material such as stainless steel (SUS) or may be made of a polymer such as polymethyl methacrylate (PMMA), polycarbonate (PC), polyacrylate (PA), polyvinyl alcohol (PVA), acrylonitrile-butadiene-styrene (ABS), polyethylene terephthalate (PET), polyimide (PI), and the like, but the present disclosure may not be limited thereto. The support structure 110 may have a structure in which one or more support layers are bonded with each other by an adhesive layer. A plurality of folding patterns may be defined in a discontinuous form at a position corresponding to the foldable area of at least one of the support layers. In this regard, the folding patterns may be holes or slits extending through the support layer, but the present disclosure may not be limited thereto.

The polarizing plate 130 may be constructed to secure visibility of the display panel 120. For example, the polarizing plate 130 may include a transparent base, a polarizer disposed on a bottom surface of the transparent base, and a phase retardation layer disposed on a bottom surface of the polarizer. The polarizing plate 130 may further include a C plate disposed on a bottom surface of the phase retardation layer. The polarizing plate 130 will be described later with reference to FIG. 4.

The light blocking layer 150 may be constructed such that an edge of the display panel 120, for example, a driver circuit, various wires, a pad, and the like of the non-display area NA, is not visible. For example, the light blocking layer 150 may be disposed at an edge of on one surface, for example, the top surface of the protective base 140. The protective base 140 may be transparent. The protective base 140 may be made of glass, for example, tempered glass. When the protective base 140 is made of the glass, the protective base 140 may have a thickness in a range from 30 to 200 μm in order to have strength characteristics and folding characteristics. For example, the protective base 140 may have a uniform thickness over an entire area thereof. The protective base 140 may include, for example, a polymer film such as polyimide (PI), polyethylene terephthalate (PET), propylene glycol (PPG), and polycarbonate (PC), but the present disclosure may not be limited thereto. The light blocking layer 150 may be formed at the edge of the top surface of the protective base 140 corresponding to the non-display area NA. The light blocking layer 150 may be formed in a ring shape. For example, the light blocking layer 150 may be formed by a printing method using black ink, but the present disclosure may not be limited thereto.

The polarizing plate 130 and the protective base 140 may be optical members. When the polarizing plate 130 is a first optical member, the protective base 140 may be a second optical member. In addition, when the protective base 140 is the first optical member, the polarizing plate 130 may be the second optical member.

The hard coating layer 160 may be disposed at an uppermost portion of the display device 100. The hard coating layer 160 may prevent components of the display device 100 from being damaged by an external impact. The hard coating layer 160 may cover the top surface of the protective base 140 and the light blocking layer 150. The hard coating layer 160 may not be attached to the top surface of the protective base 140 via another base and an adhesive layer, but may be directly formed on the top surface of the protective base 140 and the light blocking layer 150. The hard coating layer 160 may include a UV absorbent. The UV absorbent may include at least one of benzotriazole-based, benzophenone-based, salicylic acid-based, salicylate-based, cyanoacrylate-based, cinnamate-based, oxanilide-based, polystyrene-based, azomethine-based, and triazine-based absorbents, but the present disclosure may not be limited thereto. The hard coating layer 160 may include a cross-linked copolymer of an acrylate-based monomer and a photocurable elastomer. The acrylate-based monomer may, for example, include hydroxyethyl acrylate (HEA), hydroxyethyl methacrylate (HEMA), hexanediol diacrylate (HDDA), tripropylene glycol diacrylate (TPGDA), ethylene glycol diacrylate (EGDA), trimethylolpropane triacrylate (TMPTA), trimethylolpropane ethoxy triacrylate (TMPEOTA), glycerin propoxylated triacrylate (GPTA), pentaerythritol tetraacrylate (PETA), or dipentaerythritol hexaacrylate (DPHA). The photocurable elastomer may be a polymer or an oligomer having a weight average molecular weight in a range from about 1,000 to about 600,000 g/mol, or from about 10,000 to about 600,000 g/mol. For example, the photocurable elastomer may be at least one of polycaprolactone, a urethane acrylate-based polymer, and polyrotaxane. A thickness of the hard coating layer 160 may not be particularly limited, but may be, for example, in a range from 1 to 10 μm.

Further, the display device 100 according to an embodiment of the present disclosure may include at least one adhesive layer. For example, at least one adhesive layer may include a first adhesive layer 115, a second adhesive layer 125, and a third adhesive layer 135. The first adhesive layer 115 may adhere the support structure 110 and the display panel 120 to each other. The second adhesive layer 125 may adhere the display panel 120 and the polarizing plate 130 to each other. The third adhesive layer 135 may adhere the polarizing plate 130 and the protective base 140 to each other. The first to third adhesive layers may include an optically clear adhesive (OCA) or a pressure sensitive adhesive (PSA), but the present disclosure may not be limited thereto.

Figure 5:
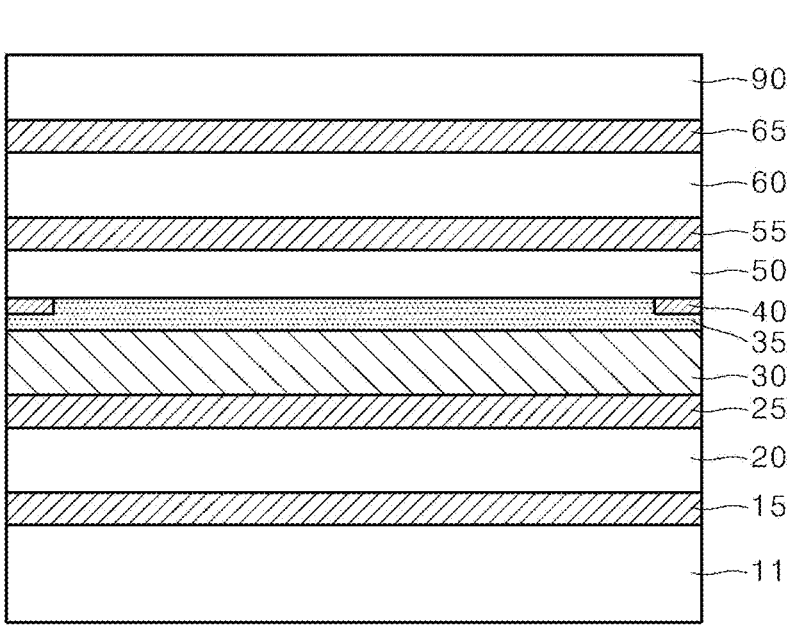
FIG. 5 is a cross-sectional view of a foldable display device according to Experimental Example.

According to an embodiment of the present disclosure, the light blocking layer 150 is disposed at the edge of the top surface of the protective base 140 and the hard coating layer 160 is immediately disposed to cover the top surface of the protective base 140 and the light blocking layer 150, so that, compared to a foldable display device 10 according to Experimental Example shown in FIG. 5, not only an overall thickness of the foldable display device 100 may be reduced, but also the folding characteristics of the foldable display device 100 may be improved. The foldable display device 100 according to an embodiment of the present disclosure may be folded with a smaller curvature radius compared to the display device 10 according to Experimental Example. Therefore, it is possible to implement a foldable display device having a smaller thickness in a folded state. Moreover, because the foldable display device 100 according to an embodiment of the present disclosure may reduce the number of stacked components compared to the display device 10 according to Experimental Example, it is possible to simplify a manufacturing process and reduce a manufacturing cost. Further, because the foldable display device 100 according to an embodiment of the present disclosure has a structure in which the hard coating layer 160 that blocks a UV ray is disposed on the top surface of the protective base 140, it is possible to prevent a change of physical properties of the polarizing plate, and accordingly, it is possible to prevent the color of light reflected by the foldable display device 100 from being greenish even when the foldable display device 100 is exposed to the UV ray for a long time.

When the protective base 140 is made of thin glass, in the process of forming the light blocking layer 150 and the hard coating layer 160 on the protective base 140, the protective base 140 may be damaged, so that handling is not easy. Accordingly, an embodiment that may additionally provide ease of handling while obtaining the same effect will be described with reference to FIGS. 3 and 4.

Figure 3:
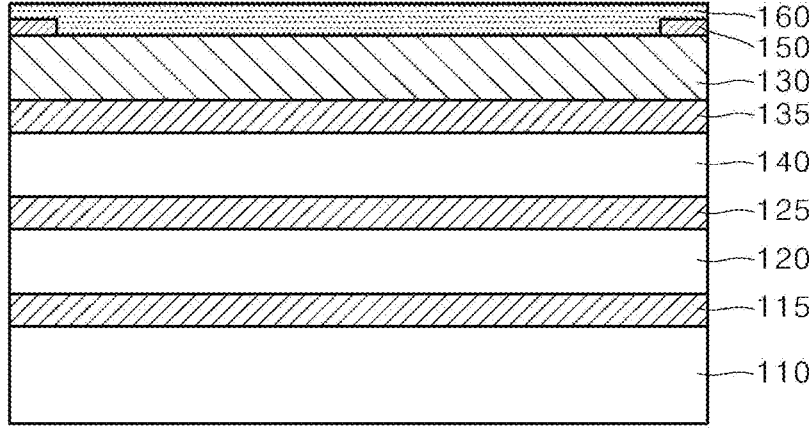
FIG. 3 is a cross-sectional view of a foldable display device according to an embodiment of the present disclosure.
Figure 4:
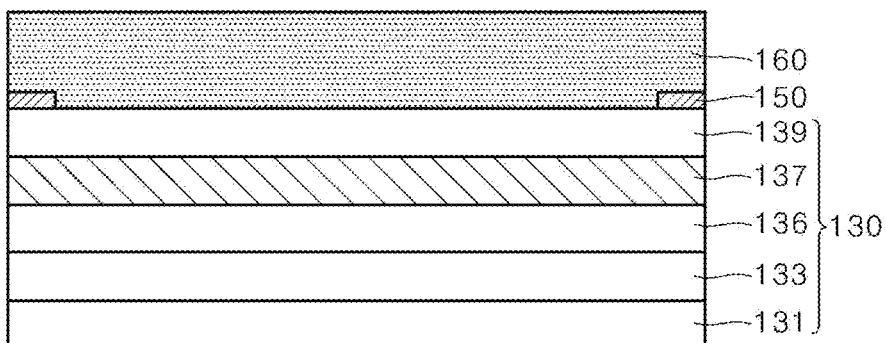
FIG. 4 is a cross-sectional view showing some components of a foldable display device according to an embodiment of the present disclosure.

FIG. 3 is a cross-sectional view of a foldable display device according to an embodiment of the present disclosure. FIG. 4 is a cross-sectional view showing some components of a foldable display device according to an embodiment of the present disclosure.

Referring to FIG. 3, a foldable display device 100-1 according to an embodiment of the present disclosure may include the display panel 120, the support structure 110, the polarizing plate 130, the protective base 140, the light blocking layer 150, and the hard coating layer 160. In describing the foldable display device 100-1 in FIG. 3, the components the same as those of the foldable display device 100 in FIG. 2 will be briefly described or omitted, and the description will be achieved focusing on differences.

The display panel 120 may be disposed on the support structure 110, and the protective base 140 may be disposed on the display panel 120. The polarizing plate 130 may be disposed on the protective base 140, and the light blocking layer 150 may be disposed on a portion of the top surface of the polarizing plate 130. Moreover, the hard coating layer 160 may be disposed on the top surface of the polarizing plate 130 and the light blocking layer 150.

The display panel 120 may be flexible and may display the image to the user. For example, the display panel 120 may be formed as the organic light-emitting display panel, but may not be limited thereto.

The support structure 110 may support the display panel 120. The support structure 110 may include at least one support layer. The support structure 110 may have the structure in which one or more support layers are bonded to each other by the adhesive layer.

The protective base 140 may be disposed on the display panel 120 to protect the display panel 120. The protective base 140 may be transparent. The protective base 140 may be made of the glass, for example, the tempered glass. When the protective base 140 is made of the glass, the protective base 140 may have the thickness in the range from 30 to 200 μm in order to have the strength characteristics and the folding characteristics. For example, the protective base 140 may have the uniform thickness over the entire area thereof. As another example, the protective base 140 may include, for example, the polymer film such as polyimide (PI), polyethylene terephthalate (PET), propylene glycol (PPG), and polycarbonate (PC), but the present disclosure may not be limited thereto.

The polarizing plate 130 may be constructed to secure the visibility of the display panel 120. The polarizing plate 130 may be disposed on the protective base 140. The polarizing plate 130 may include a polarizer 137 disposed on a bottom surface of a transparent base 139, and a phase retardation layer 133 disposed beneath the polarizer 137. The polarizing plate 130 may further include a C plate 131 disposed beneath the phase retardation layer 133.

The polarizing plate 130 and the protective base 140 may be the optical members. When the polarizing plate 130 is the first optical member, the protective base 140 may be the second optical member. In addition, when the protective base 140 is the first optical member, the polarizing plate 130 may be the second optical member.

The transparent base 139 may be made of a transparent polymer film. For example, the polymer film may include polyacrylate (PA), a cycloolefin polymer (COP), polymethyl methacrylate (PMMA), polycarbonate (PC), polyethylene (PE), polypropylene (PP), polyvinyl alcohol (PVA), diacetyl cellulose (DAC), polyethersulfone (PES), polyetheretherketone (PEEK), polyphenylsulfone (PPS), polyetherimide (PEI), polyethylene naphthalate (PEN), polyethylene terephthalate (PET), polyimide (PI), polysulfone (PSF), polyarylate (PAR), and the like.

The polarizer 137 may be formed on the bottom surface of the transparent base 139 or may be attached thereto by an adhesive. The polarizer 137 may be a linear polarizer. The linear polarizer may be an oriented polymer film including a dichroic material. The dichroic material may be a dichroic dye such as iodine, but the present disclosure may not be limited thereto. The polymer film may be a polyvinyl alcohol-based film, but the present disclosure may not be limited thereto. The dichroic material may be included in the polymer film in an oriented state. The dichroic material may be oriented by adsorbing the dichroic material to the polyvinyl alcohol-based film oriented by stretching, or by stretching the polyvinyl alcohol-based film in the state where the dichroic material is adsorbed to the polyvinyl alcohol-based film, so that a polarizing performance may be exhibited.

The phase retardation layer 133 may be attached to a bottom surface of the polarizer 137 by an adhesive layer 136. The adhesive layer 136 may include the optically clear adhesive (OCA) or the pressure sensitive adhesive (PSA), but the present disclosure may not be limited thereto. The phase retardation layer 133 may be a stretched $\lambda/4$ retardation film that imparts a phase difference of $\lambda/4$ in a direction orthogonal to a traveling direction of incident light (in an in-plane direction of the film). The $\lambda/4$ retardation film may be manufactured by stretching the polymer film such as a cellulose-based film, an olefin-based film, and a polycarbonate-based film. Further, the phase retardation layer 133 may be a liquid crystal application-type $\lambda/4$ phase retardation layer formed by applying a liquid crystal composition. The liquid crystal composition may include a liquid crystal compound having a property of showing a liquid crystal state such as nematic, cholesteric, and smectic.

The C plate 131 may be formed on a bottom surface of the phase retardation layer 133 or may be attached thereto by an adhesive. The C plate 131 may be of a liquid crystal application-type or stretched positive C plate, but the present disclosure may not be limited thereto.

The light blocking layer 150 may be constructed such that the edge of the display panel 120, for example, the driver circuit, the various wires, the pad, and the like of the non-display area NA, is not visible. For example, the light blocking layer 150 may be formed at the edge of the top surface of the polarizing plate 130 corresponding to the non-display area NA. For example, the light blocking layer 150 may be formed at an edge of a top surface of the transparent base 139 of the polarizing plate 130. The light blocking layer 150 may be formed in the ring shape. For example, the light blocking layer 150 may be formed by the printing method using the black ink, but the present disclosure may not be limited thereto.

The hard coating layer 160 may be disposed at the uppermost portion of the display device 100. The hard coating layer 160 may prevent the components of the display device 100 from being damaged by the external impact. The hard coating layer 160 may cover the top surface of the polarizing plate 130 and the light blocking layer 150. The hard coating layer 160 may not be attached to the top surface of the polarizing plate 130 via another base and an adhesive layer, but may be directly formed on the top surface of the transparent base 139 of the polarizing plate 130 and the light blocking layer 150. The hard coating layer 160 may include the UV absorbent. The hard coating layer 160 may include the cross-linked copolymer of the acrylate-based monomer and the photocurable elastomer.

The polarizing plate 130, the light blocking layer 150, and the hard coating layer 160 may be collectively constructed to form an optical stacked structure. The optical stacked structure may include the transparent base 139, the light blocking layer 150 disposed at the edge of the top surface of the transparent base 139, the hard coating layer 160 for covering the top surface of the transparent base 139 and the light blocking layer 150 and including the UV absorbent, the polarizer 137 disposed on the bottom surface of the transparent base 139, the phase retardation layer 133 disposed beneath the polarizer 137, and the C plate 131 disposed beneath the phase retardation layer 133.

When describing a method for manufacturing the optical stacked structure, the optical stacked structure may be manufactured through forming the light blocking layer 150 at the edge of the top surface of the transparent base 139, forming the hard coating layer 160 including the UV absorbent to cover the top surface of the transparent base 139 and the light blocking layer 150, forming the polarizer 137 on the bottom surface of the transparent base 139, forming the phase retardation layer 133 on the bottom surface of the polarizer 137, and forming the C plate on the bottom surface of the phase retardation layer 133. The forming of the light blocking layer 150 at the edge of the top surface of the transparent base 139 may be performed first. According to another example, after first performing the forming of the polarizer 137 on the bottom surface of the transparent base 139, the forming of the light blocking layer 150 at the edge of the top surface of the transparent base 139 may be performed.

The forming of the light blocking layer 150 may be performed, for example, by printing the black ink at the edge of the top surface of the transparent base 139, and the forming of the hard coating layer 160 may include forming a composition including the UV absorbent, the acrylate-based monomer, and the photocurable elastomer, and curing the composition.

Further, the display device 100-1 according to an embodiment of the present disclosure may include at least one adhesive layer. For example, the at least one adhesive layer may include the first adhesive layer 115, the second adhesive layer 125, and the third adhesive layer 135. The first adhesive layer 115 may adhere the support structure 110 and the display panel 120 to each other. The second adhesive layer 125 may adhere the display panel 120 and the polarizing plate 130 to each other. The third adhesive layer 135 may adhere the protective base 140 and the polarizing plate 130 to each other. The first to third adhesive layer may include the optically clear adhesive (OCA) or the pressure sensitive adhesive (PSA), but the present disclosure may not be limited thereto.

FIG. 5 is a cross-sectional view of a foldable display device according to Experimental Example.

Referring to FIG. 5, the foldable display device 10 according to Experimental Example may include a support structure 11, a display panel 20, a polarizing plate 30, a light blocking layer 40, a first protective base 50, a second protective base 60, and a cover window 90.

The display panel 20 may display the image. The support structure 11 may support the display panel 20. The support structure 11 may include at least one support layer. The polarizing plate 30 may be constructed to secure visibility of the display panel 20. For example, the polarizing plate 30 may include a polarizer and a phase retardation layer disposed on one surface of the polarizer. The light blocking layer 40 may be constructed such that an edge of the display panel 20, for example, a driver circuit, various wires, a pad, and the like of the non-display area NA, is not visible. For example, the light blocking layer 40 may be disposed at an edge of one surface, for example, a bottom surface, of the first protective base 50. The light blocking layer 40 may be formed at the edge of the bottom surface of the first protective base 50 corresponding to the non-display area NA of the display panel 20. The second protective base 60 may be disposed on the first protective base 50, and the cover window 90 may be disposed on the second protective base 60.

Further, the foldable display device 10 according to Experimental Example may include a first adhesive layer 15, a second adhesive layer 25, a third adhesive layer 35, a fourth adhesive layer 55, and a fifth adhesive layer 65. The first adhesive layer 15 may adhere the support structure 11 and the display panel 20 to each other. The second adhesive layer 25 may adhere the display panel 20 and the polarizing plate 30 to each other. The third adhesive layer 35 may adhere the polarizing plate 30 and the first protective base 50 to each other. The fourth adhesive layer 55 may adhere the first protective base 50 and the second protective base 60 to each other. The fifth adhesive layer 65 may adhere the second protective base 60 and the cover window 90 to each other.

According to an embodiment of the present disclosure disposes the light blocking layer 150 at the edge of the top surface of the polarizing plate 130 and immediately disposes the hard coating layer 160 to cover the top surface of the polarizing plate 130 and the light blocking layer 150, so that, compared to the foldable display device 10 according to Experimental Example shown in FIG. 5, not only the overall thickness of the foldable display device 100-1 may be reduced, but also the folding characteristics of the foldable display device 100-1 may be improved. The foldable display device 100-1 according to an embodiment of the present disclosure may be folded with a smaller curvature radius compared to the display device 10 according to Experimental Example. Therefore, it is possible to implement the foldable display device having the smaller thickness in the folded state. Moreover, because the foldable display device 100-1 according to an embodiment of the present disclosure may reduce the number of stacked components compared to the display device 10 according to Experimental Example, it is possible to simplify the manufacturing process and reduce the manufacturing cost. Further, because the foldable display device 100-1 according to an embodiment of the present disclosure has a structure in which the hard coating layer 160 that blocks the UV ray is disposed on the top surface of the protective base 140, it is possible to prevent the change of the physical properties of the polarizing plate, and accordingly, it is possible to prevent the color of light reflected by the foldable display device 100-1 from being greenish even when the foldable display device 100-1 is exposed to the UV ray for a long time. Further, by placing the light blocking layer 150 and the hard coating layer 160 on the top surface of the polarizing plate 130 and placing the protective base 140 below the polarizing plate 130, even when the protective base 140 is made of the glass, the foldable display device 100-1 having the reduced overall thickness may be manufactured while having the UV blocking function without a risk of damage.

The foldable display device and the method for manufacturing the same according to an embodiment of the present disclosure may be described as follows.

A foldable display device according to an embodiment of the present disclosure includes a display panel, a protective base disposed on a top surface of the display panel, a polarizing plate disposed on a top surface of the protective base, a light blocking layer disposed at an edge of a top surface of the polarizing plate, and a hard coating layer for covering the polarizing plate and the light blocking layer and including a UV absorbent.

According to some embodiments of the present disclosure, the UV absorbent may include at least one of benzo-triazole-based, benzophenone-based, salicylic acid-based, salicylate-based, cyanoacrylate-based, cinnamate-based, oxanilide-based, polystyrene-based, azomethine-based, and triazine-based absorbents.

According to some embodiments of the present disclosure, the hard coating layer may include a cross-linked copolymer of an acrylate-based monomer and a photocurable elastomer.

According to some embodiments of the present disclosure, the polarizing plate may include a transparent base and a polarizer disposed on a bottom surface of the transparent base, and the light blocking layer and the hard coating layer may be disposed on a top surface of the transparent base of the polarizing plate.

According to some embodiments of the present disclosure, the protective base may be made of glass.

A foldable display device according to another embodiment of the present disclosure includes a display panel, a first optical member disposed on the display panel, a second optical member disposed on the first optical member, a light blocking layer disposed at an edge of a top surface of the second optical member, and a hard coating layer for covering the second optical member and the light blocking layer and including a UV absorbent.

According to some embodiments of the present disclosure, the first optical member may be a protective base made of glass and the second optical member may be a polarizing plate.

According to some embodiments of the present disclosure, the polarizing plate may include a transparent base and a polarizer disposed on a bottom surface of the transparent base, and the light blocking layer and the hard coating layer may be disposed on a top surface of the transparent base.

According to some embodiments of the present disclosure, the first optical member may be a polarizing plate and the second optical member may be a protective base made of glass.

A foldable display device according to another embodiment of the present disclosure includes a display panel, and an optical stacked structure disposed on the display panel, and the optical stacked structure includes a transparent base, a light blocking layer disposed at an edge of a top surface of the transparent base, a hard coating layer for covering the top surface of the transparent base and the light blocking layer and including a UV absorbent, a polarizer disposed on a bottom surface of the transparent base, and a phase retardation layer disposed beneath the polarizer.

According to some embodiments of the present disclosure, the UV absorbent may include at least one of benzotriazole-based, benzophenone-based, salicylic acid-based, salicylate-based, cyanoacrylate-based, cinnamate-based, oxanilide-based, polystyrene-based, azomethine-based, and triazine-based absorbents.

According to some embodiments of the present disclosure, the hard coating layer may include a cross-linked copolymer of an acrylate-based monomer and a photocurable elastomer.

A method for manufacturing a foldable display device according to an embodiment of the present disclosure includes forming a light blocking layer at an edge of a top surface of a transparent base, forming a hard coating layer including a UV absorbent to cover the top surface of the transparent base and the light blocking layer, forming a polarizer on a bottom surface of the transparent base, and forming a phase retardation layer on a bottom surface of the polarizer.

According to some embodiments of the present disclosure, the forming of the hard coating layer may include forming a composition including the UV absorbent, an acrylate-based monomer, and a photocurable elastomer, and curing the composition.

It will be apparent to those skilled in the art that various modifications and variations can be made in the foldable display device and the method of manufacturing the same of the present disclosure without departing from the technical idea or scope of the disclosure. Thus, it is intended that the present disclosure cover the modifications and variations of this disclosure provided they come within the scope of the appended claims and their equivalents.

What is claimed is:

1. A foldable display device comprising:
a display panel;
a protective base disposed on a top surface of the display panel;
a polarizing plate disposed on a top surface of the protective base;
a light blocking layer directly disposed on an edge of a top surface of the polarizing plate; and
a hard coating layer directly disposed on the top surface of the polarizing plate and an upper surface and a side surface of the light blocking layer and including a UV absorbent.

2. The foldable display device of claim 1, wherein the UV absorbent includes at least one of benzotriazole-based, benzophenone-based, salicylic acid-based, salicylate-based, cyanoacrylate-based, cinnamate-based, oxanilide-based, polystyrene-based, azomethine-based, and triazine-based absorbents.

3. The foldable display device of claim 1, wherein the hard coating layer includes a cross-linked copolymer of an acrylate-based monomer and a photocurable elastomer.

4. The foldable display device of claim 1, wherein the protective base is made of glass.

5. A foldable display device comprising:
a display panel;
a first optical member disposed on the display panel;
a second optical member including a polarizer and disposed on the first optical member;
a light blocking layer directly disposed on an edge of a top surface of the second optical member; and
a hard coating layer directly disposed on the top surface of the second optical member and an upper surface and a side surface of the light blocking layer and including a UV absorbent.

6. The foldable display device of claim 5, wherein the UV absorbent includes at least one of benzotriazole-based, benzophenone-based, salicylic acid-based, salicylate-based, cyanoacrylate-based, cinnamate-based, oxanilide-based, polystyrene-based, azomethine-based, and triazine-based absorbents.

7. The foldable display device of claim 5, wherein the hard coating layer includes a cross-linked copolymer of an acrylate-based monomer and a photocurable elastomer.

8. The foldable display device of claim 5, wherein the first optical member is a protective base made of glass and the second optical member is a polarizing plate.

9. The foldable display device of claim 3, wherein the polarizing plate includes a transparent base and a polarizer disposed on a bottom surface of the transparent base, wherein the light blocking layer and the hard coating layer are disposed on a top surface of the transparent base of the polarizing plate.

10. The foldable display device of claim 8, wherein the polarizing plate includes a transparent base and a polarizer disposed on a bottom surface of the transparent base, wherein the light blocking layer and the hard coating layer are disposed on a top surface of the transparent base.

11. The foldable display device of claim 5, wherein the first optical member is a polarizing plate and the second optical member is a protective base made of glass.

* * * * *